United States Patent

[11] 3,611,206

[72] Inventors Yasutomo Miyake
Kohoku-ku;
Toshio Shinada, Chofu-shi; Kunimoto Ito,
Tokyo, all of Japan

[21] Appl. No. 851,621
[22] Filed Aug. 20, 1969
[45] Patented Oct. 5, 1971
[73] Assignee Kabushiki-Kaisha Kinsekisha-Kenkyiyo
Tokyo, Japan
[32] Priority Aug. 24, 1968
[33] Japan
[31] 43/60208

[54] TRANSISTOR CRYSTAL OSCILLATOR OPERABLE AT A SUBHARMONIC FREQUENCY OF THE CRYSTAL
2 Claims, 7 Drawing Figs.

[52] U.S. Cl. 331/116 R, 331/164
[51] Int. Cl. H03b 5/34, H03b 5/36
[50] Field of Search 331/116 R, 158, 164

[56] References Cited
UNITED STATES PATENTS

| | | | |
|---|---|---|---|
| 2,887,573 | 5/1959 | Hruska | 331/116 X |
| 2,960,666 | 11/1960 | Brewster et al. | 331/116 X |
| 3,251,007 | 5/1966 | Schmitt | 331/116 |

*Primary Examiner*—Roy Lake
*Assistant Examiner*—Siegfried H. Grimm
*Attorney*—Linton & Linton

ABSTRACT: A transistor oscillator has a piezoelectric crystal vibrator incorporated therein for the stabilization of the oscillation frequency and for producing an oscillator which may oscillate with a subharmonic of said crystal vibrator and with a middle wave range frequency.

INVENTORS
YASUTOMO MIYAKE,
TOSHIO SHINADA AND
KUNIMOTO ITO
BY Linton and Linton
ATTORNEYS INVENTORS
YASUTOMO MIYAKE,
TOSHIO SHINADA AND
KUNIMOTO ITO
BY Linton and Linton
ATTORNEYS

YASUTOMO MIYAKE, TOSHIO SHINADA AND KUNIMOTO ITO INVENTORS

BY Linton and Linton ATTORNEYS

TRANSISTOR CRYSTAL OSCILLATOR OPERABLE AT A SUBHARMONIC FREQUENCY OF THE CRYSTAL

The present invention relates to transistor oscillators having incorporated therein a piezoelectric crystal vibrator for the stabilization of oscillation frequency.

In the design of piezoelectric crystal vibrators, particularly those for the middle wave range, there is a tendency of the crystal units to take a large-sized form to cause a depression of undesirable vibration and lowering of resonance impedance. Also, the lowest vibration frequency of a crystal unit is the fundamental resonant frequency of said crystal unit. In the vibration mode of the thickness shear of a crystal unit, thickness of said crystal unit equals to one-half the fundamental wavelength of said crystal unit. And, the vibration mode of the thickness shear with frequencies lower than the above-mentioned one is not possible.

It is an object of the present invention to provide an oscillator which may oscillate with a subharmonic of the crystal unit incorporated in the same oscillator.

It is another and more specific object of the present invention to provide an oscillator which may oscillate with middle wave range frequencies by using a piezoelectric crystal unit incorporated in the same oscillator, said crystal unit having a fundamental oscillation frequency in the shortwave range.

It is still another object of the present invention to provide an oscillator having a small-sized crystal unit, said oscillator being possible to oscillate with a frequency lower than expected normally in view of the size of said crystal unit.

It is accordingly still another object of the present invention to provide a transistorized crystal oscillator of a size smaller than expected normally in view of the oscillation frequency normally possible with such a small-sized oscillator.

The feature and advantages of the present invention will become apparent by reference to the following description taken in connection with the accompanying drawings in which.

Figure 1:
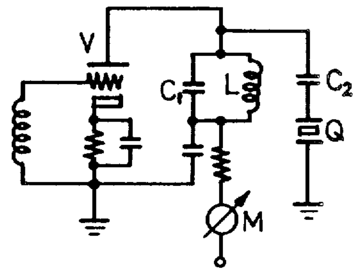
FIG. 1 is a circuit diagram of a frequency monitor for explaining the present invention.

In FIG. 1 there is shown an example of a circuit for a frequency monitor. The circuit has a quartz vibrator Q connected to the anode of valve V of an anode-tuning-type amplifier circuit. The grid input frequency of valve V is monitored by the change in the anode current at the resonance of the quartz vibrator Q. Now, when the coil in the grid circuit was put close to the coil in the plate-load-tuning circuit for forming a plate-tuning-type oscillator, and when the value of capacitance $C_1$ in the tuning circuit composed of said capacitance $C_1$ and an inductance L was varied, it was affirmed naturally with respect to self-oscillation frequency that a range of crystal control existed near the resonant frequency of said quartz vibrator. It was affirmed also that when the value of said capacitance $C_1$ is varied the plate current ammeter M showed an indication such as to be "caught" at frequencies about one-half and about one-third of said quartz vibrator resonant frequency and said indication varied with the value of series capacitance $C_2$.

It was further affirmed that when the circuit was operated as an amplifier in putting the grid circuit coil apart from said plate circuit coil, and the grid input frequencies were put to one-half or one-third of said quartz vibrator resonant frequency, that a sharp change in the anode current did not exist.

The results of the above-stated experiments will lead to a conception that there is a possibility to provide a certain range of controlling oscillation frequency by exciting a quartz vibrator with distorted waves of self-oscillation high-frequency voltage for generating free oscillation and causing phase depression in every cycle of self-oscillation.

The present invention is based upon the conception which has been stated above. A transistorized crystal oscillator according to the present invention involves a transistor which is of a highly nonlinear characteristic. Between the collector and the base of said transistor is connected a parallel tuning circuit composed of an inductance and a capacitance. A midway tap of said inductance is connected to the emitter of said transistor. A piezoelectric crystal unit is connected between said transistor collector and the emitter. And, the tuning frequency of said parallel tuning circuit is determined previously to about the fundamental resonant frequency of said piezoelectric crystal unit divided by an integer.

The present invention may provide a transistorized crystal oscillator which oscillates with subharmonics of the piezoelectric crystal unit incorporated therein and the oscillation is controlled by said crystal unit.

Figure 2:
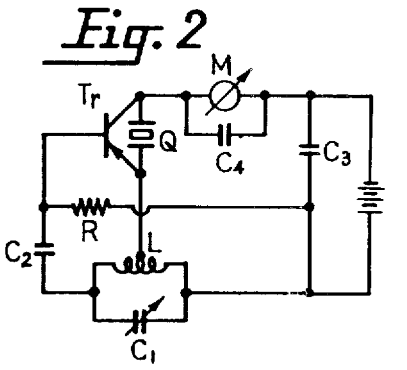
FIG. 2 is a circuit diagram of an embodiment of the present invention.

In the circuit shown in FIG. 2, Q is an A.T. cut crystal vibrator of 1,001 kilocycles of a vibration mode of the thickness shear, L is an inductance for the oscillation circuit the value of which is 350 microhenries, the winding ratio of the midway tap of said inductance coil is 3:5. $C_1$ is a variable tuning capacitance. $C_2$ and $C_3$ are respectively, a bypass condenser for cutting off direct current and the values of which condensers are respectively 500 micromicrofarads. Tr is a transistor HJ-54. M is an ammeter for the transistor collector current. $C_4$ is a bypass condenser for the ammeter M. And, R is a resistance for the bias.

Figure 3:
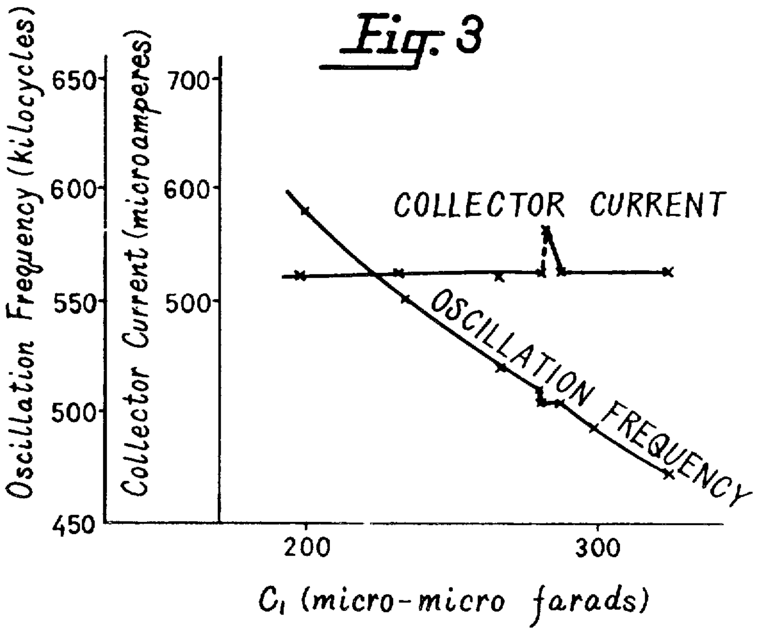
FIG. 3, FIG. 4 and FIG. 5 show for the oscillator of FIG. 2 the characteristic curves of the transistor collector current and the oscillation frequency against the value of tuning capacitance $C_1$ respectively at different values of transistor base bias resistance R.
Figure 4:
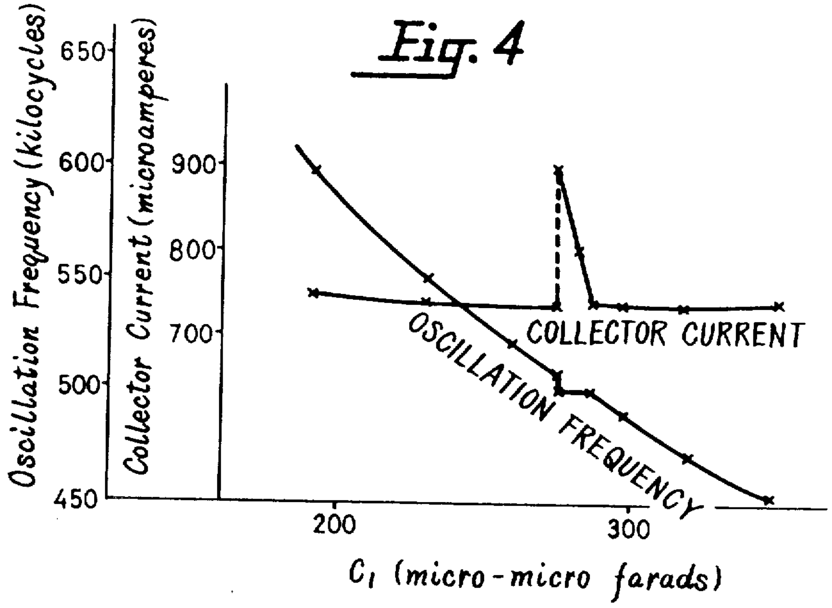
Figure 5:
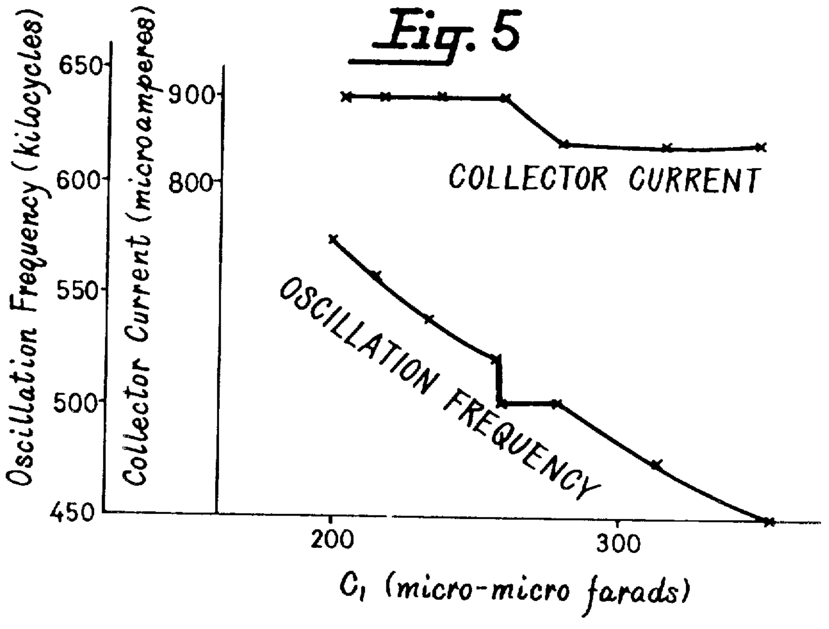

In FIG. 3 are shown, in respect of the circuit of FIG. 2, characteristic curves of the transistor collector current and the oscillation frequency against value of tuning capacitance $C_1$ at a value of the transistor base bias resistance R=100 kilohms. Also, in FIG. 4 and FIG. 5 are shown, in respect of the circuit of FIG. 2, characteristic curves similar to those shown in FIG. 3, but respectively at values of transistor base bias resistance R=50 kilohms and R=30 kilohms.

It would be obvious from these characteristic curves that the smaller the value of resistance R, the larger the range of value of tuning capacitance $C_1$ for controlling an oscillation frequency of a value which is one-half of the value of the fundamental resonant frequency of the crystal unit. The ranges of the horizontal portions in the characteristic curves of the oscillation frequency are controlled by said crystal unit in spite of a change in value of capacitance $C_1$ and are controlled sufficiently thereby against change in reactance of the circuit seen from said crystal unit terminals. According to the circuit shown in FIG. 2, taken in connection with FIG. 3, FIG. 4 and FIG. 5, oscillation frequency varies continuously in accordance with change in value of tuning capacitance $C_1$. However, the oscillation frequency holds constant controlled by the crystal at a certain range of the value of $C_1$. Accordingly, it would be obvious that curved portions showing continuous change in oscillation frequency on the frequency characteristic curves are based on self-oscillation of the oscillation circuit.

Figures 6, 7:
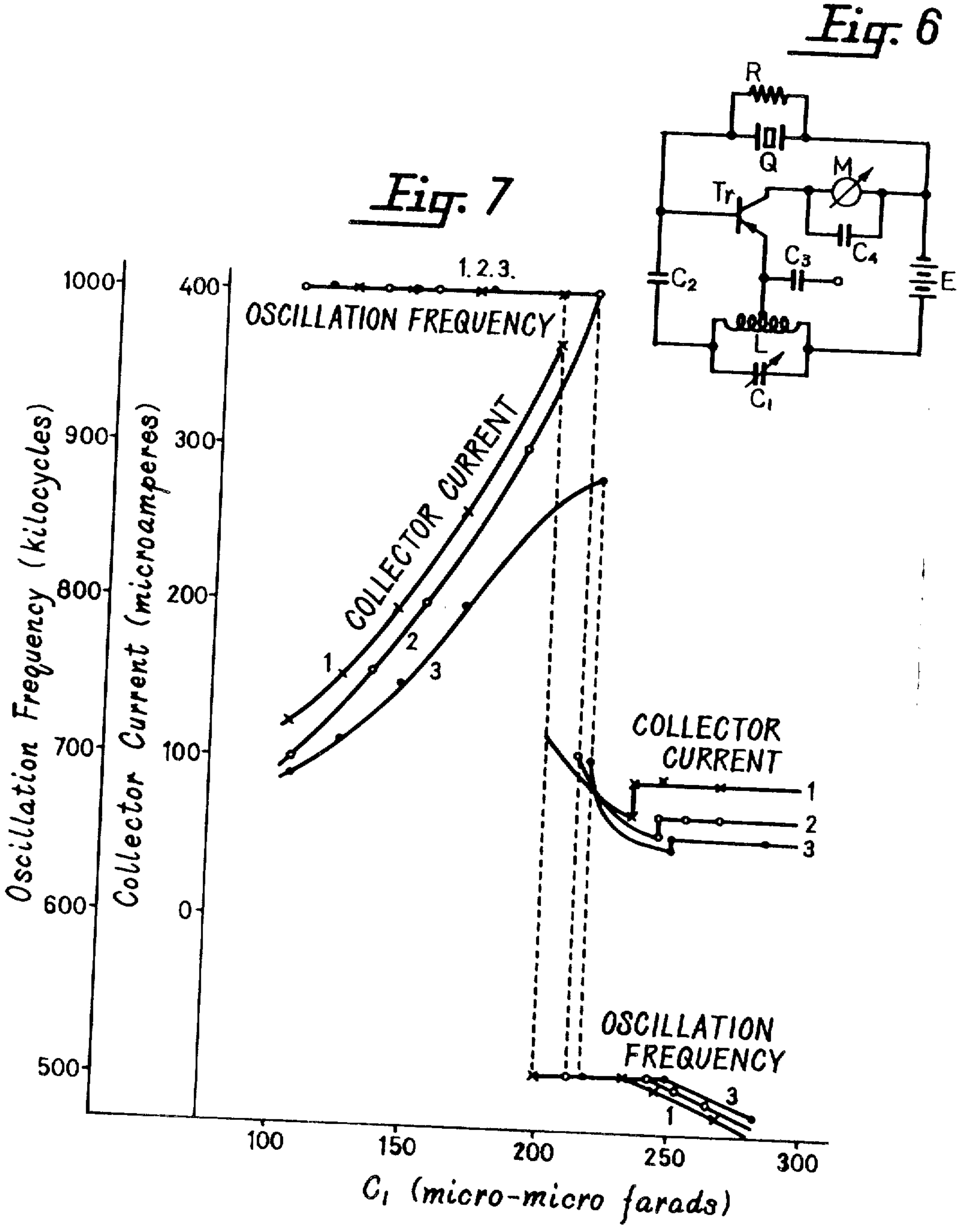
FIG. 6 is a circuit diagram of another embodiment of the present invention.
FIG. 7 shows for the oscillator of FIG. 6 characteristic curves of the transistor collector current and the oscillation frequency against value of tuning capacitance $C_1$ at different values of transistor bias resistance R.

In FIG. 6 there is shown another embodiment of the present invention. In this circuit is connected a piezoelectric crystal unit Q between the ends of the tuning circuit. A parallel tuning circuit composed of an inductance L and a capacitance $C_1$ is connected between the transistor collector and the base, and a midway tap of said inductance is connected to the transistor emitter, and also said crystal unit Q is connected between the transistor collector and the base. And further, the tuning frequency of said parallel tuning circuit is determined previously to about the fundamental resonant frequency of said crystal unit divided by an integer. This circuit may oscillate with a subharmonic of said crystal unit and is controlled thereby.

In the circuit shown in FIG. 6, Q is an A.T. cut crystal vibrator of 1,001 kilocycles of a vibration mode of the thickness shear, L is an inductance for the oscillation circuit the value of which is 350 microhenries, the winding ratio of the midway tap of said inductance coil is 4:5. $C_1$ is a variable tuning capacitance. $C_2$ is a bypass condenser the value of which is 500 micromicrofarads, M is an ammeter for transistor collector current and $C_4$ is a bypass condenser therefor. $C_3$ is a condenser for the output. E is a direct current source having a voltage of 7 volts. Tr is a transistor HJ-54. And, R is a bias resistance.

In FIG. 7 there is shown characteristic curves of the transistor collector current and the oscillation frequency against the value of the tuning capacitance $C_1$. It would be obvious from these characteristic curves that from about 50 micromicrofarads to about 200 micromicrofarads in the value of variable capacitance $C_1$, the oscillation is controlled by the fundamental resonant frequency of the crystal unit, and that from about 200 micromicrofarads to about 250 micromicrofarads in the value of said $C_1$, the oscillation is controlled by one-half fundamental resonant frequency of said crystal unit. In FIG. 7, the curves shown at numerals 1, 2, and 3 correspond respectively to the values of resistance R, 30 kilohms, 40 kilohms and 50 kilohms.

It would be apparent from the above description that an oscillator according to the present invention may oscillate with a subharmonic of the piezoelectric crystal vibrator incorporated therein. And also, it may operate quite stably despite some change in the circuit reactance. In consequence, the present invention may provide oscillators producing low-frequency outputs without using a piezoelectric crystal vibrator of a low fundamental resonant frequency and with a large size which corresponds to said low frequency, this causing the circuit to be simple, small, inexpensive and quite practical.

What is claimed for Letters Patent is:

1. A transistorized piezoelectric crystal oscillator for being controlled by a piezoelectric crystal vibrator incorporated therein and producing oscillation with a subharmonic of said crystal vibrator, which comprises a transistor, a parallel tuning circuit composed of an inductance and a capacitance connected between the collector and the base of said transistor, a midway tap of said inductance being connected to the emitter of said transistor, said crystal vibrator being connected between the collector and the emitter of said transistor, and the tuning frequency of said parallel tuning circuit tuned to about the fundamental frequency of said crystal vibrator divided by an integer.

2. A transistorized piezoelectric crystal oscillator for being controlled by a piezoelectric crystal vibrator incorporated therein and producing oscillation with a subharmonic of said crystal vibrator, which comprises a transistor, a parallel tuning circuit composed of an inductance and a capacitance connected between the collector and the base of said transistor, a midway tap of said inductance being connected to the emitter of said transistor, said crystal vibrator being connected between the collector and the base of said transistor, and the tuning frequency of said parallel tuning circuit being tuned to about the fundamental frequency of said crystal vibrator divided by an integer.